United States Patent
Ishikawa et al.

(10) Patent No.: US 7,049,217 B2
(45) Date of Patent: May 23, 2006

(54) METHOD OF FORMING MULTI-PILED BUMP

(75) Inventors: Naoki Ishikawa, Kawasaki (JP);
Shuichi Takeuchi, Kawasaki (JP);
Hidehiko Kira, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 211 days.

(21) Appl. No.: 10/817,807

(22) Filed: Apr. 6, 2004

(65) Prior Publication Data

US 2005/0090091 A1  Apr. 28, 2005

(30) Foreign Application Priority Data

Oct. 28, 2003 (JP) .............................. 2003-366814

(51) Int. Cl.
*H01L 21/44* (2006.01)

(52) U.S. Cl. .................. 438/613; 438/614; 438/617

(58) Field of Classification Search ........ 438/613–615, 438/617; 257/737, 738
See application file for complete search history.

(56) References Cited

U.S. PATENT DOCUMENTS

| | | | | |
|---|---|---|---|---|
| 5,440,239 | A | * | 8/1995 | Zappella et al. ............. 324/757 |
| 5,476,211 | A | * | 12/1995 | Khandros ................. 228/180.5 |
| 6,483,190 | B1 | * | 11/2002 | Kainuma et al. ............ 257/737 |
| 6,492,737 | B1 | * | 12/2002 | Imasu et al. ................. 257/778 |
| 6,583,483 | B1 | | 6/2003 | Masumoto et al. ......... 257/459 |
| 2002/0050653 | A1 | | 5/2002 | Masumoto et al. ......... 257/784 |
| 2002/0079354 | A1 | * | 6/2002 | Lee .......................... 228/180.5 |
| 2002/0149118 | A1 | * | 10/2002 | Yamaguchi et al. ......... 257/778 |
| 2003/0006268 | A1 | * | 1/2003 | Shieh et al. ............. 228/110.1 |
| 2003/0122638 | A1 | * | 7/2003 | Tarui et al. .................. 333/246 |
| 2003/0166333 | A1 | * | 9/2003 | Takahashi ................... 438/617 |
| 2003/0205725 | A1 | | 11/2003 | Masumoto et al. ......... 257/200 |
| 2003/0218793 | A1 | * | 11/2003 | Soneda et al. .............. 359/291 |
| 2004/0159958 | A1 | * | 8/2004 | Funaki ....................... 257/780 |
| 2004/0262774 | A1 | * | 12/2004 | Kang .......................... 257/777 |
| 2005/0017336 | A1 | * | 1/2005 | Kung et al. ................. 257/685 |
| 2005/0205995 | A1 | * | 9/2005 | Ishikawa et al. ............ 257/738 |

FOREIGN PATENT DOCUMENTS

| | | |
|---|---|---|
| JP | 6-302645 | 10/1994 |
| JP | 9-167771 | 6/1997 |
| JP | 9-246273 | 9/1997 |
| JP | 2002-43357 | 2/2002 |
| JP | 2004281668 A | * 10/2004 |

* cited by examiner

*Primary Examiner*—Mary Wilczewski
*Assistant Examiner*—Toniae M. Thomas
(74) *Attorney, Agent, or Firm*—Westerman, Hattori, Daniels & Adrian, LLP.

(57) ABSTRACT

In the method of forming a multi-piled bump, metal balls can be stably and securely piled so as to form the multi-piled bump having a prescribed height. The method of the present invention comprises the steps of: holding a metal wire by a capillary; sparking and melting the wire so as to form metal balls; piling a plurality of the metal balls with applying a load and ultrasonic vibrations thereto, and characterized in that a tail length of the metal wire, which is held by the capillary, is controlled to make a gap between a center of the metal wire and a center of the metal ball one half of a diameter of the metal wire or less.

5 Claims, 4 Drawing Sheets

FIG.1A
FIG.1B
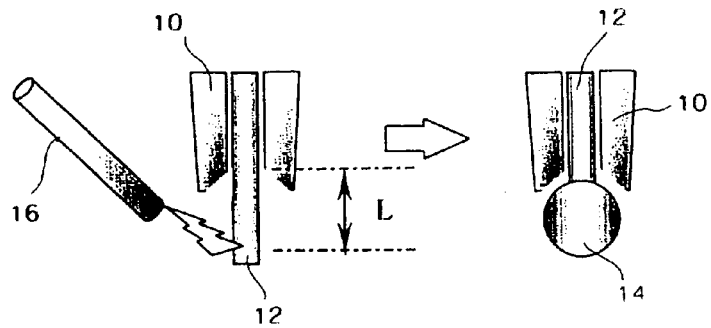
FIG.2
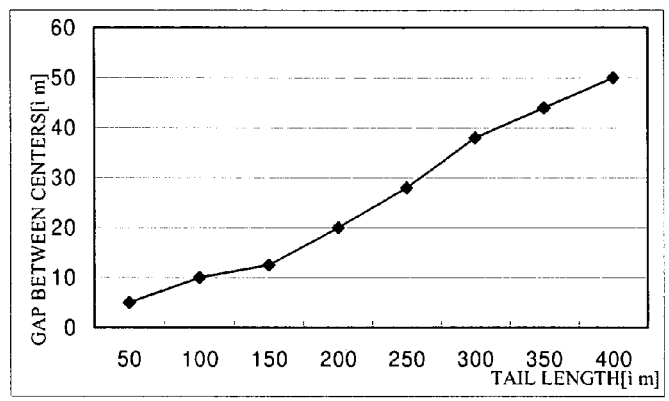
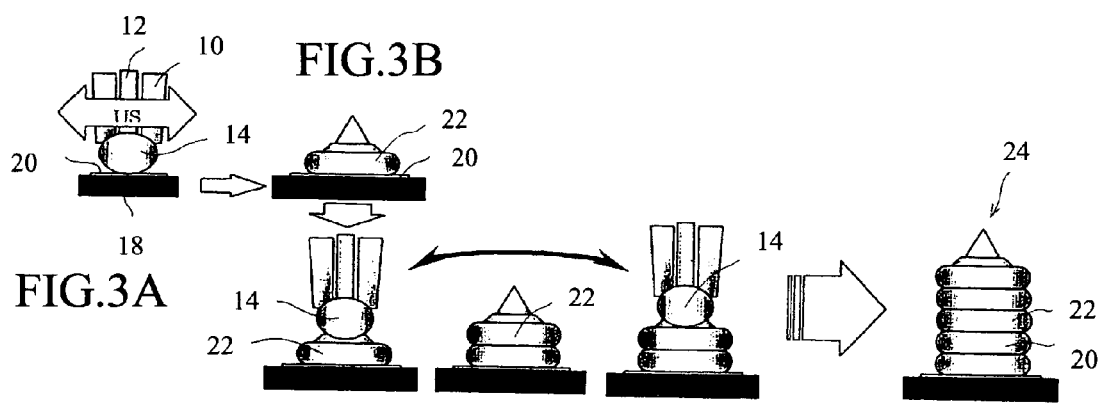
FIG.3A  FIG.3B
FIG.3C  FIG.3D  FIG.3E  FIG.3F

METHOD OF FORMING MULTI-PILED BUMP

BACKGROUND OF THE INVENTION

The present invention relates to a method of forming a multi-piled bump on an electrode of a semiconductor chip, etc.

A semiconductor chip, which will be flip chip-connected, has stud bumps formed on aluminum pads, and the semiconductor chip is mounted, for example, on a substrate of a printed circuit board by electrically connecting the stud bumps to electrodes of the substrate. Generally, the bump is formed on the pads of the semiconductor chip by the steps of: sparking and melting a front end of a metal wire so as to form a metal ball; and pressing the metal ball onto the pad, by a capillary, with applying ultrasonic vibrations so as to connect the metal ball with the pad.

Each of the bumps is formed by one metal ball, and its height is determined on the basis of a size of the metal ball formed at the front end of the metal wire, a pressing force applied to the metal ball to connect with the pad and a power of the ultrasonic vibrations applied to the metal ball.

In the case that high bumps are required due to parts arrangement on the substrate, limitation of mounting the semiconductor chip, etc., diameters of the ball metals are made greater so as to make the bumps higher. However, width of the bumps are made greater in proportion to the diameters thereof, so separations between the bumps cannot be made narrower. In another method, the pressing force applied to each metal ball is made small so as not to make the metal ball thicker. In this method, however, connecting strength between the bumps and the pads are lowered, so that the bumps cannot be formed stably. Further, if the power of the ultrasonic vibrations is lowered so as to make the bumps higher, the same problem occurs.

To solve the problems, a method of forming multi-piled stud bumps on pads of a semiconductor chip is disclosed in Japanese Patent Gazette No. 2002-43357. In the method, 3–6 stud bumps (metal balls) are piled by a capillary, which is used for wire bonding, so as to form each multi-piled bump.

By employing the multi-piled bumps, the bumps can be made higher without making their diameters greater. Therefore, separations between the multi-piled bumps can be narrower. Further, the height of the multi-piled bump can be easily adjusted by selecting number of piling the metal balls. However, the metal balls having small diameters cannot be stably and securely piled by merely adjusting boding conditions.

SUMMARY OF THE INVENTION

An object of the present invention is to provide a method of forming a multi-piled bump, in which metal balls can be stably and securely piled so as to form the multi-piled bump having a prescribed height.

To achieve the object, the present invention has following constitutions.

Namely, the method of the present invention comprises the steps of: holding a metal wire by a capillary; sparking and melting the wire so as to form metal balls; piling a plurality of the metal balls with applying a load and ultrasonic vibrations thereto, and characterized in that a tail length of the metal wire, which is held by the capillary, is controlled to make a gap between a center of the metal wire and a center of the metal ball one half of a diameter of the metal wire or less.

In the method, the load applied to the upper metal ball may be smaller than that applied to the lower metal ball.

In the method, a power of the ultrasonic vibrations applied to the upper metal ball may be smaller than that applied to the lower metal ball.

In the method, a time for applying the ultrasonic vibrations to the upper metal ball may be shorter than that to the lower metal ball.

In the method, a moving speed of the capillary may be changed from a high speed to a low speed at a detection starting level when the metal balls are piled at a bump position, a standard height may be four fifth of a height of the multi-piled bump, and the detection starting level may be determined on the basis of the standard height.

In the method of the present invention, the metal balls can be securely piled to form the multi-piled bump. The multi-piled bump having a prescribed bump can be easily formed. By employing the method to a semiconductor chip, the semiconductor chip can be mounted by many manners. The multi-piled bump can be formed not only in the semiconductor chip but also on an electrode of a substrate.

BRIEF DESCRIPTION OF THE DRAWINGS

Embodiments of the present invention will now be described by way of examples and with reference to the accompanying drawings, in which:

FIGS. 1A and 1B are explanation views showing a step of melting a metal wire to form a metal ball;

FIG. 2 is a graph showing a relationship between a tail length and a gap between centers of the metal ball and the metal wire;

FIGS. 3A–3F are explanation views showing steps of forming a multi-piled bump;

DETAILED DESCRIPTION OF THE EMBODIMENTS

Figure 4:
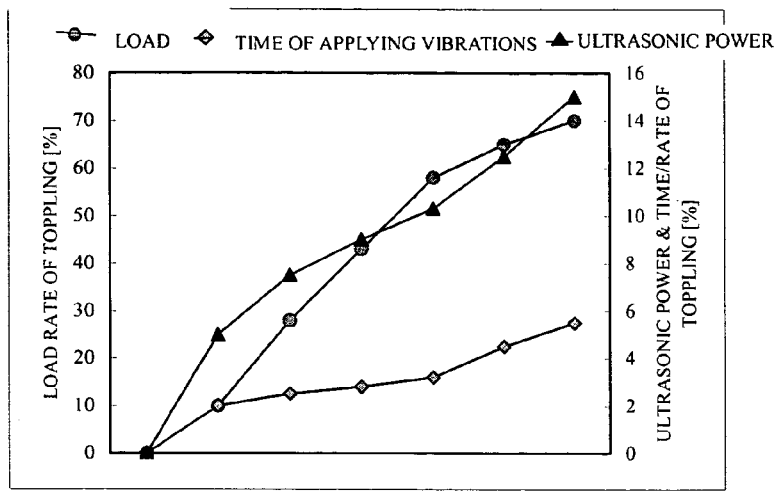
FIG. 4 is a graph showing rate of toppling the multi-piled bump with respect to loads applied to the metal balls, etc.
Figure 4:
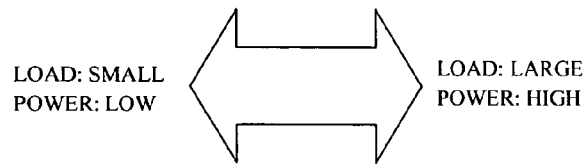

Preferred embodiments of the present invention will now be described in detail with reference to the accompanying drawings.

FIGS. 1A and 1B are explanation views showing a step of forming a metal ball 14, in which a front end of a metal wire 12 extended from a capillary 10 is melted to form the metal ball 14. As shown in FIG. 1A, the front end of the metal wire 12 is extended from the capillary 10. Electricity is discharged and sparked between the front end of the metal wire 12 and a discharging electrode 16, so that the front end of the metal wire is melted and formed into a spherical shape. This spherical metal is the metal ball 14 (see FIG. 1B).

When electricity is discharged and sparked between the metal wire 12 and the electrode 16, the metal wire 12 is extended outward from a front end of the capillary 10. The extended length L of the metal wire 12 is called "tail length". Conventionally, the tail length was 150–300 i m. FIG. 2 is a graph showing a relationship between the tail length L and a gap between a center of the metal ball 14 and a center of the metal wire 12 in a horizontal plane. According to FIG. 2, the longer the tail length L is extended, the greater the gap becomes. When the metal wire 12 is extended from the capillary longer, the metal wire 12 is apt to twist so that the center of the metal ball 14 is shifted with respect to the center of the metal wire 12.

The center of the metal wire 12 coincides with a center of the capillary 10 or a standard position of bonding or piling the metal ball 14. If the center of the metal ball 14 is shifted from the center of the metal wire 12, the metal ball 14 cannot be correctly positioned and bonding at a bump position. Further, if the centers are shifted each other, the metal wire 12 is bent when the metal ball 14 is bonded, so that the metal ball 14 cannot be securely and correctly bonded.

To securely and correctly pile the metal balls 14 to form the multi-piled bump, the tail length L or the length of the metal wire 12 extended from the capillary 10 should be made as short as possible. If tension applied to the metal wire 12, which is fed to the capillary 10, is great, curvature of the metal wire 12 is made great. Therefore, the tension applied to the metal wire 12 should be made as small as possible.

To securely and correctly pile the metal balls 14, the tail length L of the metal wire 12 should be controlled to make the gap between the center of the metal wire 12 and the center of the metal ball 14 one half of a diameter of the metal wire 12 or less. For example, in the case of using the metal wire 12 whose diameter is 20 μm, the preferred tail length L is 100 μm or less so as to make the gap 10 μm or less. Since the metal ball 14 is formed at the front end of the metal wire 12, a predetermined length of the metal wire 12 must be extended from the capillary 10. In this case, the preferred tail length L is 60–100 μm.

The metal ball 14 is formed at the front end of the metal wire 12 by electric discharge or spark, so the metal wire 12 is made of a metal which can be easily formed into a spherical shape by spark, e.g., gold, copper, aluminum. Gold, copper and aluminum can be easily formed into thin wires. The diameter of the metal wire 12 is determined on the basis of a size of a bump (the metal ball) to be formed. Diameters of ordinary metal wires are 15 μm and 20 μm. A diameter of the metal ball 14 formed with the metal wire 12 having the diameter of 20 μm is 35–40 μm.

The metal wire 12 may be a mere metal thin wire. Further, the surface of the metal wire 12 may be coated with another metal so as to stably form the metal ball 14 and improve bondability of the metal ball 14. A copper wire, for example, is hard to form into a good spherical shape, so the surface of the copper wire may be coated with another metal whose melting point is lower than that of copper, e.g., palladium. By coating with palladium, the molten palladium encases copper when the coated copper wire is sparked and melted, so that the front end of the wire can be formed into the metal ball. Further, the surface of the metal wire may be coated with another metal capable of securely bonding the metal ball to a pad.

FIGS. 3A–3F show the steps of forming a multi-piled bump on a pad 20 of a semiconductor chip 18.

In FIG. 3A, the metal ball 14 is positioned and bonded on the pad 20, which is formed in a surface of the semiconductor chip 18. A load is applied to the metal ball 14, and ultrasonic vibrations are applied to the capillary so as to bond the metal ball 14 to the pad 20. In FIG. 3B, the metal ball 14 is bonded to the pad 20 as a first bump 22. Since the capillary 10 presses the metal ball 14 to bond, the bump 22 is formed slightly flat. For example, in the case of the bump 22 having a diameter of 35–40 μm, a height of the bump 22 is about 22 μm.

After the metal ball 14 is bonded to the pad 20 by the capillary 10, the capillary 10 is moved upward to cut the metal wire 12, so that a needle-shaped chip is left at a center of an upper face of the bump 22.

In FIG. 3C, a second bump 22 is positioned and piled on the first bump 22. The metal ball 14 is pressed onto the first bump 22 by the capillary 10, and ultrasonic vibrations are applied to bond the metal ball 14 thereto. In FIG. 3D, the second bump 22 is completed. In FIG. 3E, the metal ball 14, which becomes a third bump 22, is positioned and piled on the second bump 22.

Namely, the metal ball 14 is positioned and piled onto the lower bump 22 so as to form a multi-piled bump 24 shown in FIG. 3F. In FIG. 3F, the multi-piled bump 24 includes five bumps 22 (metal balls 14). The multi-piled bump can be formed by repeatedly piling the metal balls 14. Note that, the height of the multi-piled bump can be optionally controlled by adjusting the number of piling the bumps or the metal balls.

FIG. 4 is a graph showing optimum conditions for securely forming the multi-piled bump shown in FIGS. 3A–3F. Namely, the graph of FIG. 4 shows rate of toppling the multi-piled bump with respect to the load applied to the metal ball 14, a power of the ultrasonic vibrations applied to the metal ball 14 and time for applying the ultrasonic vibrations.

The horizontal axis of the graph shown in FIG. 4 indicates the load, the ultrasonic power and the time for applying ultrasonic vibrations. They increase with advancing rightward along the horizontal axis. According to the graph, the multi-piled bump is apt to be toppled with increasing the load for bonding the metal balls. Further, the multi-piled bump is apt to be toppled with increasing the ultrasonic power and the time for applying the ultrasonic vibrations.

If the load, the ultrasonic power and the time for applying ultrasonic vibrations are too great and too long, the multi-piled bump is apt to be toppled down. To stably form the multi-piled bump, the load, the ultrasonic power and the time for applying ultrasonic vibrations must be reduced.

Even if the load, the ultrasonic power and the time are merely reduced, bonding strength between the metal balls is low so that the metal balls cannot be securely piled. To securely pile the metal balls with enough bonding strength and prevent the multi-piled bump from toppling down, it is effective to make energy or amplitude of ultrasonic vibrations great and make the time for applying the ultrasonic vibration short.

In the present embodiment, the load, the ultrasonic power and the time for applying ultrasonic vibrations are great and long in an initial stage of forming the multi-piled bump, so that the metal ball can be securely bonded. Then, the load, the ultrasonic power and the time for applying ultrasonic vibrations are gradually reduced with piling the metal balls. Namely, shock applied to the upper metal balls are limited. By changing bonding conditions for each layer or metal ball as described above, the multi-piled bump can be securely formed.

Figure 5:
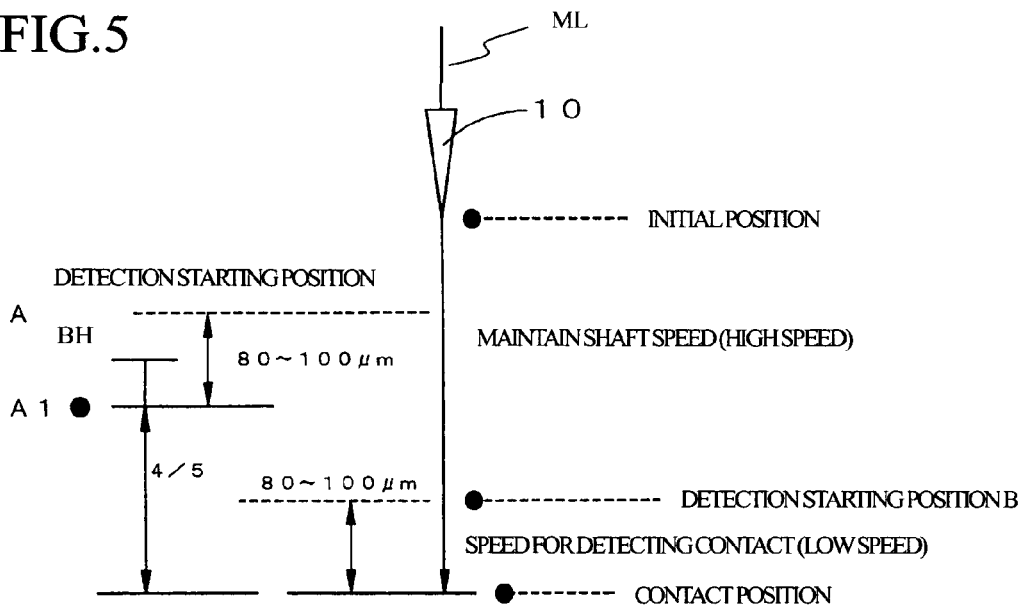
FIG. 5 is an explanation view showing a manner of detecting a bump position and piling the metal balls.

FIG. 5 is an explanation view showing a manner of detecting the bump position and piling the metal balls. In FIG. 5, a conventional manner is shown on the right side of a moving line ML of the capillary 10; the manner of the present embodiment is shown on the left side of the moving line ML thereof.

Firstly, the conventional manner will be explained. When the metal ball 14 is positioned at the predetermined position, firstly the capillary 10 is moved to a position above a contact position, then the capillary 10 is moved toward the contact position to bond the metal ball 14. A moving speed of the capillary 10 from an initial position to a detection starting position B is a high speed; a moving speed of the capillary 10 from the detection starting position B to the contact position is a low speed so that the metal ball 14 can be securely bonded at the contact position.

A usual height of the detection starting position B from the contact position is 80–100 μm. The detection starting position B is usually automatically determined after a bonding device detects the contact position. In the case of determining the detection starting position B on the basis of the contact position, if the multi-piled bump is higher than the detection starting position B, the capillary collides with the piled metal ball at the high speed before detecting the contact position so that the metal balls cannot be piled any more. Namely, if the detection starting position B is determined by the conventional manner, the multi-piled bump cannot be securely formed.

On the other hand, in the manner of the present embodiment, the detection starting position (level) A2 is located 80–100 μm above a standard height A1, which is determined on the basis of the height BH of the multi-piled bump.

In the present embodiment, the standard height A1 is four fifth of the height BH of the multi-piled bump, and the detection starting level A2 is determined on the basis of the standard height A1. For example, in the case of forming the multi-piled bump which includes 10 metal balls and whose height is 200 μm, the height of the standard position A1 from the pad is 200 μm×⅘=160 μm. Therefore, the detection starting level A2 for piling the metal balls is 80–100 μm above the standard position A1.

In the bonding device which automatically determines the detection starting position or level, the detection starting level A2 may be manually inputted. Since a distance between the pad and the detection starting position A2 is longer than that of the conventional manner, the distance in which the capillary 10 moves at the low speed is long so that it takes a long time to pile the metal ball. However, the pad position can be correctly detected, and the multi-piled bump can be securely formed.

Figure 6A:
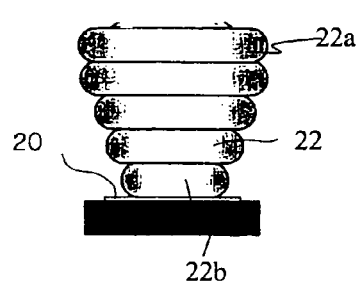
FIGS. 6A–6C are explanation views showing examples of the multi-piled bump.
Figure 6B:
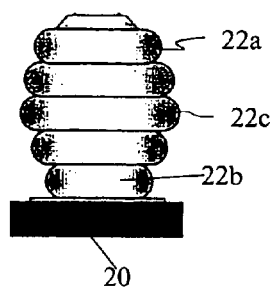
Figure 6C:
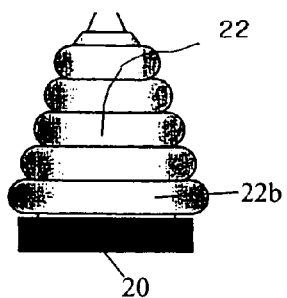

FIGS. 6A–6C show examples of the multi-piled bump. The multi-piled bump 24 shown in FIG. 3F is formed like a pillar by piling the bumps 22 having the same diameters.

In FIG. 6A, a lower end bump 22b on the pad 20 is the smallest. Namely, diameters of the bumps 22 are gradually made greater toward an upper end bump 22a. In FIG. 6B, the intermediate bump 20c is the largest. Namely, diameters of the bumps are gradually made smaller, from the intermediate bump 22c, toward an upper end bump 22a and a lower end bump 22b. In FIG. 6C, a lower end bump 22b on the pad 20 is the largest. Namely, diameters of the bumps 22 are gradually made greater toward a lower end bump 22b. The multi-piled bump shown in FIG. 6C can be stably formed on the pad 20.

The multi-piled bump may be formed by piling the bumps (metal balls) having same diameters or different diameters.

In the above described embodiment, the bumps 22 or the metal balls 14 are piled by melting the same metal wire 12. Further, the bumps 22 or the metal balls 14 may be piled by melting different metal wires made of different kinds of metals. In this case, the multi-piled bump includes the metal balls made of a plurality of kinds of metals.

Figure 7A:
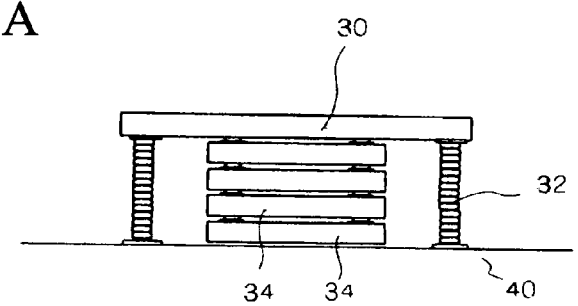
FIGS. 7A and 7B are explanation views of mounted semiconductor chips, which have the multi-piled bumps.
Figure 7B:
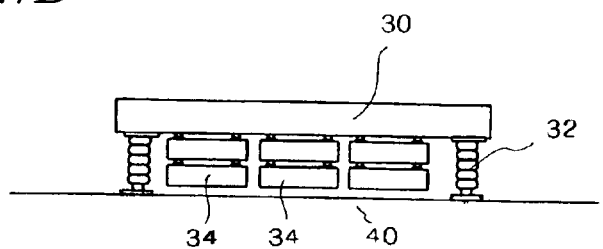

FIGS. 7A and 7B are explanation views of a mounted semiconductor chip 30, which has the multi-piled bumps 32 formed by the method of the above described embodiment.

In FIGS. 7A and 7B, semiconductor chips 34 are stuck on pad faces of the semiconductor chip 30, and the semiconductor chips 30 is mounted on a substrate 40 together with the semiconductor chips 34. In FIG. 7A, four semiconductor chips 34 are piled; in FIG. 7B, two semiconductor chips 34 are piled. Even if the height of the piled semiconductor chips 34 is about 200 μm, the semiconductor chip 30, on which the semiconductor chips 34 are stuck, can be easily mounted by having the multi-piled bumps 32 whose height are 200 μm or more.

Figure 8A:
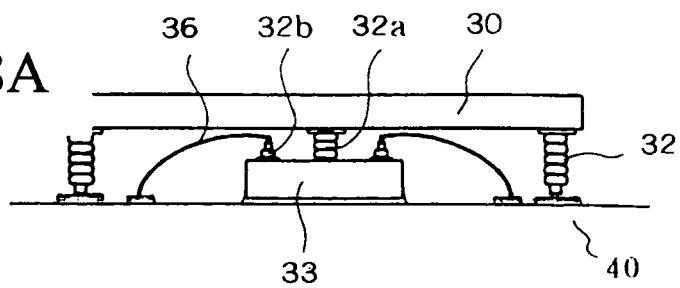
FIGS. 8A–8C are explanation views of mounted semiconductor chips, which have the multi-piled bumps.
Figure 8B:
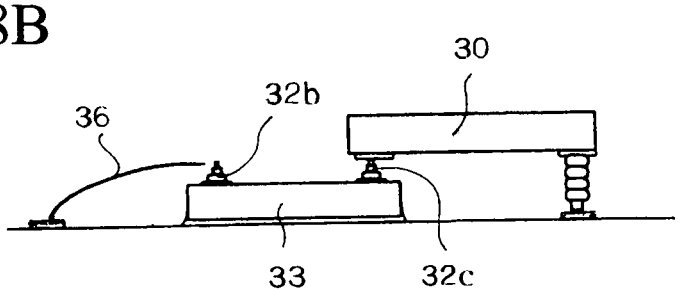
Figure 8C:
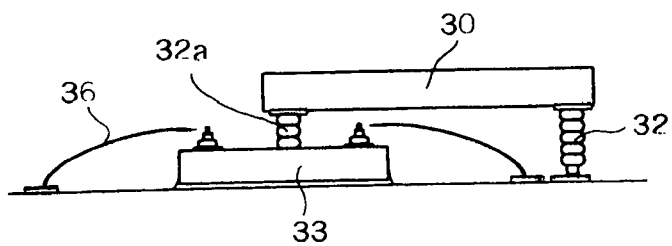

FIGS. 8A–8C are explanation views of mounted semiconductor chips, which are mounted by flip-chip connection and wire bonding.

In FIG. 8A, a semiconductor chip 33 is mounted by wire bonding within a mount area of a semiconductor chip 30, which is mounted on a substrate by flip-chip connection. The semiconductor chip 33 is electrically connected to the semiconductor chip 30 by multi-piled bumps 32a. Further, multi-piled bumps 32b are employed as pads of the semiconductor chip 33, which are connected by wire bonding. Since the semiconductor chip 30 is mounted on a substrate 40 with multi-piled bumps 32, the semiconductor chip 33 can be easily mounted, with bonding wires 36, within the mount area of the semiconductor chip 30.

In FIG. 8B, a semiconductor chip 33 is electrically connected to a semiconductor chip 30 by multi-piled bumps 32c formed on pads of the semiconductor chip 33. In FIG. 8C, a semiconductor chip 33 is electrically connected to a semiconductor chip 30 by multi-piled bumps 32a formed on pads of the semiconductor chip 30.

By employing the multi-piled bumps 32, the semiconductor chips 30 and 33 can be stereoscopically combined and mounted. Namely, many kinds of mounting forms can be realized.

Figure 9:
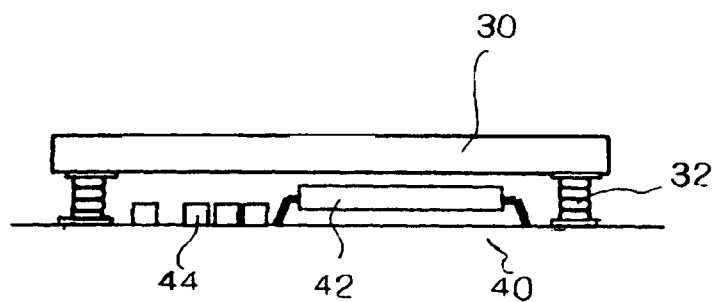
FIG. 9 is an explanation view of a semiconductor chip mounted, which has the multi-piled bumps.

FIG. 9 shows an example of a semiconductor chip 30 mounted on a substrate 40, by flip-chip connection, together with electronic parts 42 and 44. The parts 42 and 44 are provided in a space between the semiconductor chip 30 and the substrate 40. The space is formed by multi-piled bumps 32. By employing the multi-piled bumps 32, the parts 42 and 44 can be mounted in a mount area of the semiconductor chip 30.

The invention may be embodied in other specific forms without departing from the spirit or essential characteristics thereof. The present embodiments are therefore to be considered in all respects as illustrative and not restrictive, the scope of the invention being indicated by the appended claims rather than by he foregoing description and all changes which come within the meaning and range of equivalency of the claims are therefore intended to be embraced therein.

What is claimed is:

1. A method of forming a multi-piled bump, comprising the steps of:
   holding a metal wire by a capillary;
   sparking and melting the wire so as to form metal balls;
   piling a plurality of the metal balls with applying a load and ultrasonic vibrations thereto,
   wherein that a tail length of the metal wire, which is held by the capillary, is controlled to make a gap between a center of the metal wire and a center of the metal ball one half of a diameter of the metal wire or less.

2. The method according to claim 1,
wherein the load applied to the upper metal ball is smaller than that applied to the lower metal ball.

3. The method according to claim 1,
wherein a power of the ultrasonic vibrations applied to the upper metal ball is smaller than that applied to the lower metal ball.

4. The method according to claim 1,
wherein a time for applying the ultrasonic vibrations to the upper metal ball is shorter than that to the lower metal ball.

5. The method according to claim 1,
wherein a moving speed of the capillary is changed from a high speed to a low speed at a detection starting level when the metal balls are piled at a bump position, a standard height is four fifth of a height of the multi-piled bump, and the detection starting level is determined on the basis of the standard height.

* * * * *